United States Patent
Zhang et al.

(10) Patent No.: US 11,134,493 B2
(45) Date of Patent: Sep. 28, 2021

(54) WLAN PHYSICAL LAYER DESIGN FOR EFFICIENT HYBRID ARQ

(71) Applicant: NXP USA, Inc., Austin, TX (US)

(72) Inventors: Yan Zhang, Palo Alto, CA (US); Hongyuan Zhang, Fremont, CA (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/583,295

(22) Filed: Sep. 26, 2019

(65) Prior Publication Data

US 2020/0107325 A1 Apr. 2, 2020

Related U.S. Application Data

(60) Provisional application No. 62/740,293, filed on Oct. 2, 2018.

(51) Int. Cl.

| | |
|---|---|
| *H04W 72/04* | (2009.01) |
| *H03M 13/11* | (2006.01) |
| *H04L 1/00* | (2006.01) |
| *H04L 1/18* | (2006.01) |
| *H04W 84/12* | (2009.01) |

(52) U.S. Cl.
CPC .... *H04W 72/0466* (2013.01); *H03M 13/1111* (2013.01); *H04L 1/0008* (2013.01); *H04L 1/0061* (2013.01); *H04L 1/189* (2013.01); *H04L 1/1816* (2013.01); *H04W 84/12* (2013.01)

(58) Field of Classification Search
CPC ................................................ H04W 72/0466
See application file for complete search history.

(56) References Cited

U.S. PATENT DOCUMENTS 9,876,614 B1 * 1/2018 Sun ....................... H04L 1/1685
10,135,582 B1 * 11/2018 Sun ....................... H04L 1/1887
(Continued)

OTHER PUBLICATIONS

IEEE Draft Standard P802.11ax D4.0, "IEEE Draft Standard for Information Technology—Telecommunications and Information Exchange Between Systems; Local and Metropolitan Area Networks—Specific Requirements Part 11: Wireless LAN Medium Access Control (MAC) and Physical Layer (PHY) Specifications Amendment Enhancements for High Efficiency WLAN", section 27.3.11.4 (pp. 581), Feb. 2019.

(Continued)

*Primary Examiner* — Parth Patel

(57) ABSTRACT

A method for Wireless Local-Area Network (WLAN) communication in a WLAN device includes generating a WLAN transmission including first bits, by at least (i) encoding the first bits with a Forward Error Correction (FEC) code to produce first encoded bits, and (ii) scrambling the first encoded bits with a first scrambling sequence. The WLAN transmission is transmitted from the WLAN device to a remote WLAN device. In response to receiving from the remote WLAN device an indication that reception of the WLAN transmission has failed, a WLAN retransmission including second bits is generated. Generating the retransmission includes (i) obtaining second encoded bits, which include the second bits encoded with the FEC code, and (ii) scrambling the second encoded bits with a second scrambling sequence that is different from the first scrambling sequence. The WLAN retransmission is transmitted from the WLAN device to the remote WLAN device.

20 Claims, 3 Drawing Sheets

(56) References Cited

U.S. PATENT DOCUMENTS

| | | | |
|---|---|---|---|
| 10,383,147 B2* | 8/2019 | Rajagopal | H04W 28/0284 |
| 10,660,102 B1* | 5/2020 | Patel | H04W 48/00 |
| 2003/0228850 A1* | 12/2003 | Hwang | H04L 1/0026 |
| | | | 455/101 |
| 2005/0249244 A1* | 11/2005 | McNamara | H04L 1/0025 |
| | | | 370/474 |
| 2007/0121946 A1* | 5/2007 | Ito | H04L 1/0072 |
| | | | 380/270 |
| 2007/0230632 A1* | 10/2007 | Bai | H04L 25/067 |
| | | | 375/341 |
| 2008/0095091 A1* | 4/2008 | Surineni | H04W 52/0225 |
| | | | 370/311 |
| 2008/0159537 A1* | 7/2008 | Khan | H04L 25/03866 |
| | | | 380/268 |
| 2012/0195302 A1* | 8/2012 | Park | H04L 1/0075 |
| | | | 370/338 |
| 2012/0263160 A1* | 10/2012 | Choi | H04L 1/0083 |
| | | | 370/338 |
| 2012/0300874 A1* | 11/2012 | Zhang | H04W 72/046 |
| | | | 375/295 |
| 2013/0121323 A1* | 5/2013 | Lilleberg | H04L 1/1845 |
| | | | 370/338 |
| 2014/0376358 A1* | 12/2014 | Eder | H04L 1/0057 |
| | | | 370/216 |
| 2015/0016360 A1* | 1/2015 | Merlin | H04L 1/0075 |
| | | | 370/329 |
| 2015/0172006 A1* | 6/2015 | Wang | H04L 1/1812 |
| | | | 370/329 |
| 2015/0358998 A1* | 12/2015 | Golitschek Edler Von Elbwart | H04L 1/1861 |
| | | | 370/280 |
| 2016/0204924 A1* | 7/2016 | Li | H04L 5/0053 |
| | | | 370/280 |
| 2016/0285594 A1* | 9/2016 | Chen | H04L 1/1607 |
| 2017/0170930 A1* | 6/2017 | Guzelgoz | H04L 1/0035 |
| 2017/0180086 A1* | 6/2017 | Xiong | H04L 5/0053 |
| 2018/0076992 A1* | 3/2018 | Nabetani | H04L 27/26 |
| 2018/0220426 A1* | 8/2018 | Rico Alvarino | H04J 11/005 |
| 2018/0227867 A1* | 8/2018 | Park | H04W 56/001 |
| 2018/0331693 A1* | 11/2018 | Lou | H04L 1/0061 |
| 2019/0044669 A1* | 2/2019 | Davydov | H04L 5/005 |
| 2019/0327054 A1* | 10/2019 | Kons | H04L 25/0242 |
| 2020/0052832 A1* | 2/2020 | Tian | H04L 1/1845 |
| 2020/0107325 A1* | 4/2020 | Zhang | H04L 25/03866 |
| 2020/0187265 A1* | 6/2020 | Luo | H04L 5/0053 |
| 2021/0022187 A1* | 1/2021 | Xu | H04W 74/006 |
| 2021/0160931 A1* | 5/2021 | Shi | H04W 28/06 |

OTHER PUBLICATIONS

International Application # PCT/IB2019/058159 search report dated Dec. 10, 2019.

802.11 REVmd D2.1, "IEEE Draft Standard for Information Technology—Telecommunications and Information Exchange Between Systems; Local and Metropolitan Area Networks—Specific Requirements—Part 11: Wireless LAN Medium Access Control (MAC) and Physical Layer (PHY) Specifications", section 63.27 (pp. 440-448), section 17.3.3.55 (pp. 2907-2909), Feb. 2019.

* cited by examiner

WLAN PHYSICAL LAYER DESIGN FOR EFFICIENT HYBRID ARQ

CROSS-REFERENCE TO RELATED APPLICATIONS

This application claims the benefit of U.S. Provisional Patent Application 62/740,293, filed Oct. 2, 2018, whose disclosure is incorporated herein by reference.

FIELD OF THE DISCLOSURE

The present disclosure relates generally to Wireless Local-Area Networks (WLAN), and particularly to Hybrid Automatic Repeat Request (HARQ) in WLAN devices.

BACKGROUND

Various communication systems use Automatic Repeat Request (ARQ) schemes for data retransmission. ARQ and Block Acknowledgement (BA) mechanisms for Wireless Local-Area Networks (WLANs) are specified, for example, in IEEE Draft Standard 802.11 REVmd D2.1, entitled "IEEE Draft Standard for Information Technology—Telecommunications and Information Exchange Between Systems; Local and Metropolitan Area Networks—Specific Requirements—Part 11: Wireless LAN Medium Access Control (MAC) and Physical Layer (PHY) Specifications," February, 2019, e.g., in section 6.3.27.

U.S. Pat. No. 9,876,614 describes Hybrid ARQ (HARQ) schemes for WLAN. A method for transmission of media access control (MAC) protocol data units (MPDUs) over a WLAN communication channel is described. A first PHY data unit is generated at a first communication device and transmitted. The first PHY data unit has a data field that includes a first MPDU to be transmitted to a second communication device, and a PHY signal field that includes a transmission version field set to indicate an initial transmission of the first MPDU. In response to determining that a first acknowledgment has not been received, a second PHY data unit is generated at the first communication device and transmitted. The second PHY data unit has a data field that includes the first MPDU, and a PHY signal field that includes a transmission version field set to indicate a retransmission of the first MPDU.

Scrambling and descrambling in WLAN systems are specified, for example, in section 17.3.3.5.5 of IEEE Draft Standard 802.11 REVmd D2.1, cited above, and in section 27.3.11.4 of IEEE Draft Standard P802.11ax D4.0, entitled "IEEE Draft Standard for Information Technology—Telecommunications and Information Exchange Between Systems; Local and Metropolitan Area Networks—Specific Requirements Part 11: Wireless LAN Medium Access Control (MAC) and Physical Layer (PHY) Specifications Amendment Enhancements for High Efficiency WLAN," February, 2019.

The description above is presented as a general overview of related art in this field and should not be construed as an admission that any of the information it contains constitutes prior art against the present patent application.

SUMMARY

An embodiment that is described herein provides a method for Wireless Local-Area Network (WLAN) communication in a WLAN device. The method includes generating a WLAN transmission including first bits, by at least (i) encoding the first bits with a Forward Error Correction (FEC) code to produce first encoded bits, and (ii) scrambling the first encoded bits with a first scrambling sequence. The WLAN transmission is transmitted from the WLAN device to a remote WLAN device. In response to receiving from the remote WLAN device an indication that reception of the WLAN transmission has failed, a WLAN retransmission including second bits is generated. Generating the retransmission includes (i) obtaining second encoded bits, which include the second bits encoded with the FEC code, and (ii) scrambling the second encoded bits with a second scrambling sequence that is different from the first scrambling sequence. The WLAN retransmission is transmitted from the WLAN device to the remote WLAN device.

In some embodiments, generating the WLAN transmission includes generating a first Medium Access Control Protocol Data Unit (MPDU) at a first position within a first Aggregate MPDU (A-MPDU), and generating the WLAN retransmission includes generating a second MPDU at a second position within a second A-MPDU, the second position being different from the first position. In an embodiment, scrambling the first encoded bits with the first scrambling sequence includes scrambling the first encoded bits with a first offset of a bit sequence, and scrambling the second encoded bits with the second scrambling sequence includes scrambling the second encoded bits with a second offset of the bit sequence, the second offset being different from the first offset.

In some embodiments, generating the WLAN retransmission includes generating a repeated copy of the WLAN transmission. In alternative embodiments, generating the WLAN retransmission includes generating one or more redundancy bits of the FEC code that do not appear in the WLAN transmission.

There is additionally provided, in accordance with an embodiment that is described herein, a method for Wireless Local-Area Network (WLAN) communication in a WLAN device. The method includes receiving a WLAN transmission carrying data from a remote WLAN device. First soft-decoding metrics are computed for the WLAN transmission, and the first soft-decoding metrics are de-scrambled with a first scrambling sequence, to produce first de-scrambled soft-decoding metrics. A WLAN retransmission corresponding to the WLAN transmission is received from the remote WLAN device. Second soft-decoding metrics are computed for the WLAN retransmission, and the second soft-decoding metrics are de-scrambled with a second scrambling sequence that is different from the first scrambling sequence, to produce second de-scrambled soft-decoding metrics. The first de-scrambled soft-decoding metrics and the second de-scrambled soft-decoding metrics are combined, to produce combined soft-decoding metrics. The data carried by the WLAN transmission is reconstructed by applying Forward Error Correction (FEC) decoding to the combined soft-decoding metrics derived from the WLAN transmission and the WLAN retransmission.

In some embodiments, receiving the WLAN transmission includes receiving a first Medium Access Control Protocol Data Unit (MPDU) at a first position within a first Aggregate MPDU (A-MPDU), and receiving the WLAN retransmission includes receiving a second MPDU at a second position within a second A-MPDU, the second position being different from the first position. In an embodiment, de-scrambling the first soft-decoding metrics with the first scrambling sequence includes de-scrambling the first soft-decoding metrics with a first offset of a bit sequence, and de-scrambling the second soft-decoding metrics with the second scrambling sequence includes de-scrambling the second soft-decoding metrics with a second offset of the bit sequence, the second offset being different from the first offset.

In some embodiments, receiving the WLAN retransmission includes receiving a repeated copy of the WLAN transmission. In alternative embodiments, receiving the WLAN retransmission includes receiving one or more redundancy bits of the FEC code that do not appear in the WLAN transmission.

There is also provided, in accordance with an embodiment that is described herein, a Wireless Local-Area Network (WLAN) device including a Medium Access Control (MAC) processor and physical-layer (PHY) circuitry. The MAC processor is configured to generate first bits to be transmitted in a WLAN transmission to a remote WLAN device, and, in response to receiving from the remote WLAN device an indication that reception of the WLAN transmission has failed, to generate second bits to be transmitted in a WLAN retransmission to the remote WLAN device. The PHY circuitry is configured to generate the WLAN transmission including the first bits, by at least (i) encoding the first bits with a Forward Error Correction (FEC) code to produce first encoded bits, and (ii) scrambling the first encoded bits with a first scrambling sequence, to transmit the WLAN transmission to the remote WLAN device, to generate the WLAN retransmission including the second bits, by at least (i) obtaining second encoded bits, which include the second bits encoded with the FEC code, and (ii) scrambling the second encoded bits with a second scrambling sequence that is different from the first scrambling sequence, and to transmit the WLAN retransmission to the remote WLAN device.

There is further provided, in accordance with an embodiment that is described herein, a Wireless Local-Area Network (WLAN) device including physical-layer (PHY) circuitry and a Medium Access Control (MAC) processor. The PHY circuitry is configured to receive a WLAN transmission carrying data from a remote WLAN device, to compute first soft-decoding metrics for the WLAN transmission, and de-scramble the first soft-decoding metrics with a first scrambling sequence, so as to produce first de-scrambled soft-decoding metrics, to receive from the remote WLAN device a WLAN retransmission corresponding to the WLAN transmission, to compute second soft-decoding metrics for the WLAN retransmission, and de-scramble the second soft-decoding metrics with a second scrambling sequence that is different from the first scrambling sequence, so as to produce second de-scrambled soft-decoding metrics, to combine the first de-scrambled soft-decoding metrics and the second de-scrambled soft-decoding metrics so as to produce combined soft-decoding metrics, and to reconstruct the data carried by the WLAN transmission by applying Forward Error Correction (FEC) decoding to the combined soft-decoding metrics derived from the WLAN transmission and the WLAN retransmission. The MAC processor is configured to generate a request for the WLAN retransmission, in response to a failure in reconstructing the data from the WLAN transmission.

The present disclosure will be more fully understood from the following detailed description of the embodiments thereof, taken together with the drawings in which:

DETAILED DESCRIPTION OF EMBODIMENTS

Figure 1:
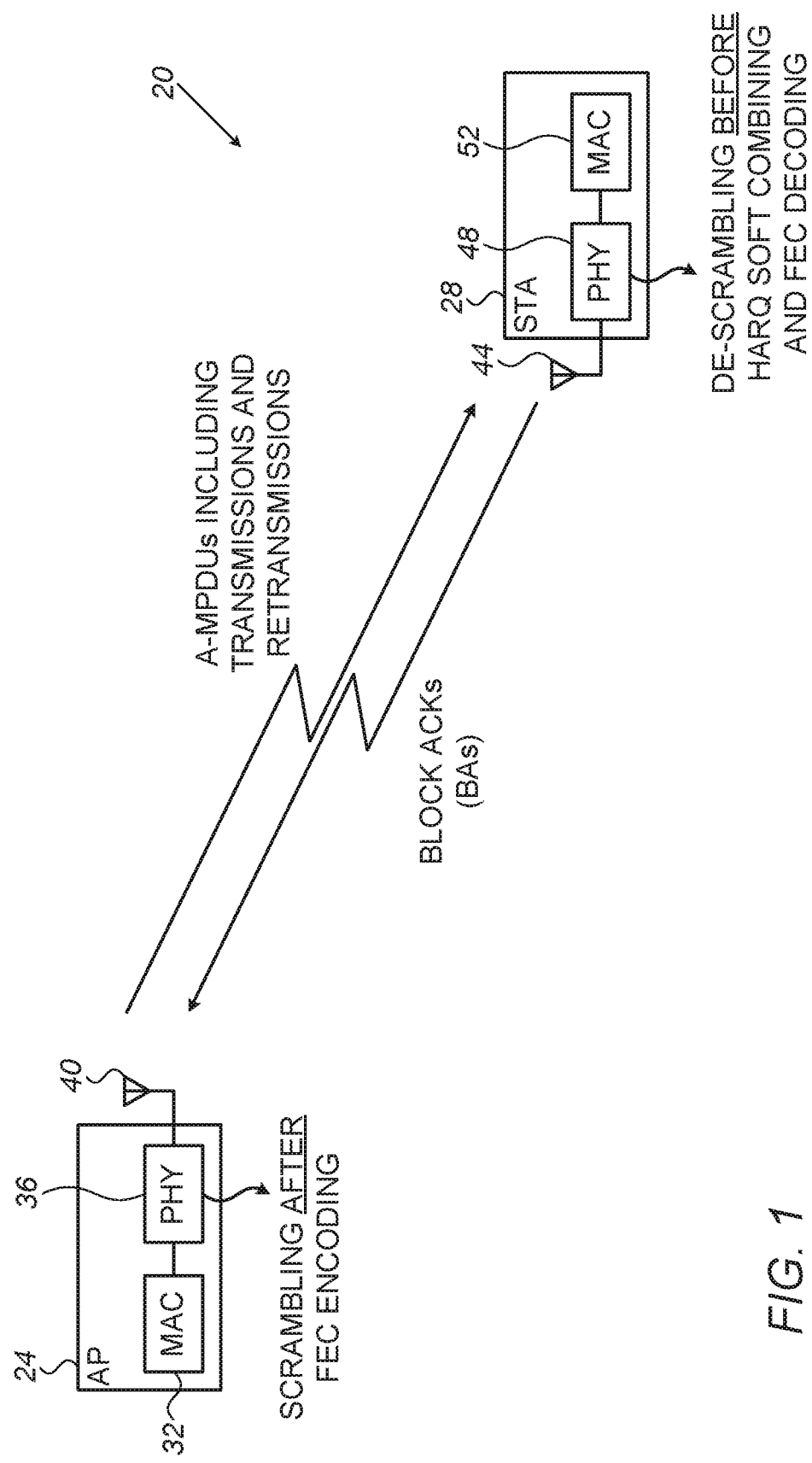
FIG. 1 is a block diagram that schematically illustrates a WLAN communication system, in accordance with an embodiment that is described herein.

Embodiments that are described herein provide Hybrid Automatic Repeat Request (HARQ) techniques for WLAN devices, such as Access Points (APs) and client stations (STAs). The disclosed techniques are applicable to the forward channel (AP to STA), to the reverse channel (STA to AP), as well as to sidelink channels (STA to STA) if used. As such, the description that follows refers to "a transmitter" (which may comprise a transmitter of an AP or of an STA) and to "a receiver" (which may comprise a receiver of an AP or of an STA).

In a typical HARQ scheme, in accordance with an embodiment, the transmitter transmits to the receiver a transmission (e.g., a packet or a frame) whose data is encoded with a Forward Error Correction (FEC) code. The term "packet" in this context refers generally to a data unit in the physical layer (PHY), whereas the term "frame" generally refers to a data unit in the Medium Access Control (MAC) layer. The receiver receives the transmission, computes soft-bits for the bits of the received data, and attempts to decode the FEC code based on the soft-bits. In the present context, the term "soft-bits" (also referred to as soft-decoding metrics) refers to non-binary metrics that are indicative not only of the data value (e.g., "0" or "1") but also of the confidence level or reliability of this data value.

If FEC decoding fails, the receiver notifies the transmitter of the failure and the transmitter transmits a retransmission. The retransmission may simply repeat the transmission, and/or it may comprise additional redundancy bits of the FEC that were not transmitted in the transmission. The receiver receives the retransmission, and computes soft-bits for the received bits of the retransmission.

For bits that are present both in the transmission and in the retransmission, the receiver combines the soft-bits of the retransmission with the corresponding soft-bits of the transmission. When the retransmission is a repeated copy of the transmission, the receiver combines each soft-bit of the retransmission with the soft-bits of the corresponding bit of the transmission (this scheme is sometimes referred to as Chase Combining—CC). When the retransmission also comprises additional redundancy bits, the receiver combines soft-bits of corresponding bits that appear both in the transmission and in the retransmission, whereas bits that appear only in the retransmission do not undergo combining (this scheme is sometimes referred to as Incremental Redundancy—IR).

The receiver then reattempts to decode the FEC based on the combined soft-bits. This process may be repeated, if needed, by requesting and receiving one or more additional retransmissions. By combining soft-bits in this manner, HARQ schemes achieve superior error performance, and thus enable enhanced throughput and capacity.

In some embodiments, in addition to FEC decoding and HARQ, the transmitter applies scrambling to the data being transmitted, and the receiver applies de-scrambling to the received data. Scrambling on the transmitter side, and de-scrambling on the receiver side, are typically performed by bit-wise multiplying the sequence of bits by a scrambling sequence that is coordinated between the transmitter and the receiver. The scrambling operation assists in randomizing the data and balancing the occurrence probabilities of the various possible data-value sequences.

In practice, scrambling/de-scrambling may complicate the HARQ implementation considerably and/or cause performance degradation. As can be seen from the description above, HARQ requires that the receiver combine soft-bits of corresponding bits of the transmission and the retransmission. The receiver should therefore be able to access corresponding bits of the transmission and the retransmission, notwithstanding the scrambling applied to the transmission and the retransmission.

In some embodiments described herein, the transmitter applies scrambling after FEC encoding, i.e., encodes the bits (or the transmission or of the retransmission) with the FEC code, and scrambles the encoded bits. The receiver performs the opposite sequence of operations, i.e., applies de-scrambling before soft-bit combining and FEC decoding. This solution effectively decouples the scrambling and HARQ mechanisms from one another. For example, the transmitter is permitted to scramble the transmission and the retransmission with different scrambling sequences.

The freedom to scramble the transmission and the retransmission with different scrambling sequences is useful, for example, in WLAN modes that use frame aggregation as specified in the IEEE 802.11 standards. In frame aggregation, the transmitter aggregates multiple MAC Protocol Data Units (MPDUs) into an Aggregate MPDU (A-MPDU) and transmits the A-MPDU to the receiver. The receiver responds with a Block Acknowledgement (BA), which notifies the transmitter which of the MPDUs in the A-MPDU were received correctly and which MPDUs have failed. The transmitter retransmits failed MPDUs in some subsequent A-MPDU.

In accordance with the IEEE 802.11 standards, the transmitter and the receiver initialize the scrambling sequence at the beginning of the A-MPDU (and not on every individual MPDU). In addition, the transmitter is not required to transmit a retransmitted MPDU in the same position in the A-MPDU as the original (failed) MPDU. These two features mean that, with very high likelihood, the original MPDU and the retransmitted MPDU will be scrambled with different scrambling sequences. (In the present context, scrambling with different offsets of the same scrambling sequence is also considered "scrambling with different scrambling sequences".) When using the disclosed technique, the transmitter and receiver are able to perform HARQ regardless of the different scrambling sequences used in the original and retransmitted MPDUs.

The embodiments described herein refer mainly to frame aggregation in accordance with the IEEE 802.11 standard. This choice is made, however, solely by way of example. The disclosed techniques are applicable in any other suitable operational mode and/or any other suitable WLAN standard or protocol that can benefit from scrambling and HARQ.

FIG. 1 is a block diagram that schematically illustrates a WLAN communication system 20, in accordance with an embodiment that is described herein. System 20 comprises an AP 24 and an STA 28. In an embodiment, although not necessarily, AP 24 and STA 28 operate in accordance with one of the IEEE 802.11 standards, e.g., 802.11ac or 802.11ax. The figure shows a single AP 24 and a single STA 28, for clarity. Real-life systems, however, typically comprise multiple STAs 28 and may comprise multiple APs 24.

In the present example, AP 24 comprises a Medium Access Control (MAC) processor 32 that is configured to perform the various MAC functions of the AP, physical-layer (PHY) circuitry 36 that is configured to perform the various PHY functions of the AP, and one or more antennas 40 for transmitting and receiving WLAN signals.

Among other functions, MAC processor 32 is configured to generate MPDUs, including both MPDUs that comprise original transmissions and MPDUs that comprise retransmissions of MPDUs whose receptions at STA 28 have failed. PHY circuitry 36 is configured to apply FEC encoding and scrambling to the MPDUs. As will be shown below, scrambling is performed after FEC encoding.

In the embodiment of FIG. 1, STA 28 comprises one or more antennas 44 for transmitting and receiving WLAN signals, PHY circuitry 48 that is configured to perform the various PHY functions of the STA, and a MAC processor 52 that is configured to perform the various MAC functions of the STA.

Among other functions, PHY circuitry 48 is configured to apply soft-bit computation, de-scrambling, soft-bit combining and FEC decoding to the data of received MPDUs, including both MPDUs that comprise original transmissions and MPDUs that comprise retransmissions. As will be shown below, de-scrambling is performed prior to soft-combining and FEC decoding. MAC processor 52 is configured to extract successfully-decoded data from received MPDUs, and to generate Block Acknowledgements (BAs) that are fed back to AP 24.

The description above focuses on HARQ and scrambling forward-channel communication, i.e., transfer of data from AP 24 to STA 28, for the sake of clarity. Typically, AP 24 and STA 28 and their components are also configured to communicate over the reverse channel, i.e., to transfer data from STA 28 to AP 24. Therefore, the description below refers generally to PHY circuitry 36 as "transmit-side PHY circuitry", and to PHY circuitry 48 as "receive-side PHY circuitry". The disclosed HARQ and scrambling techniques are nevertheless applicable to reverse-channel communication, as well.

Figure 2:
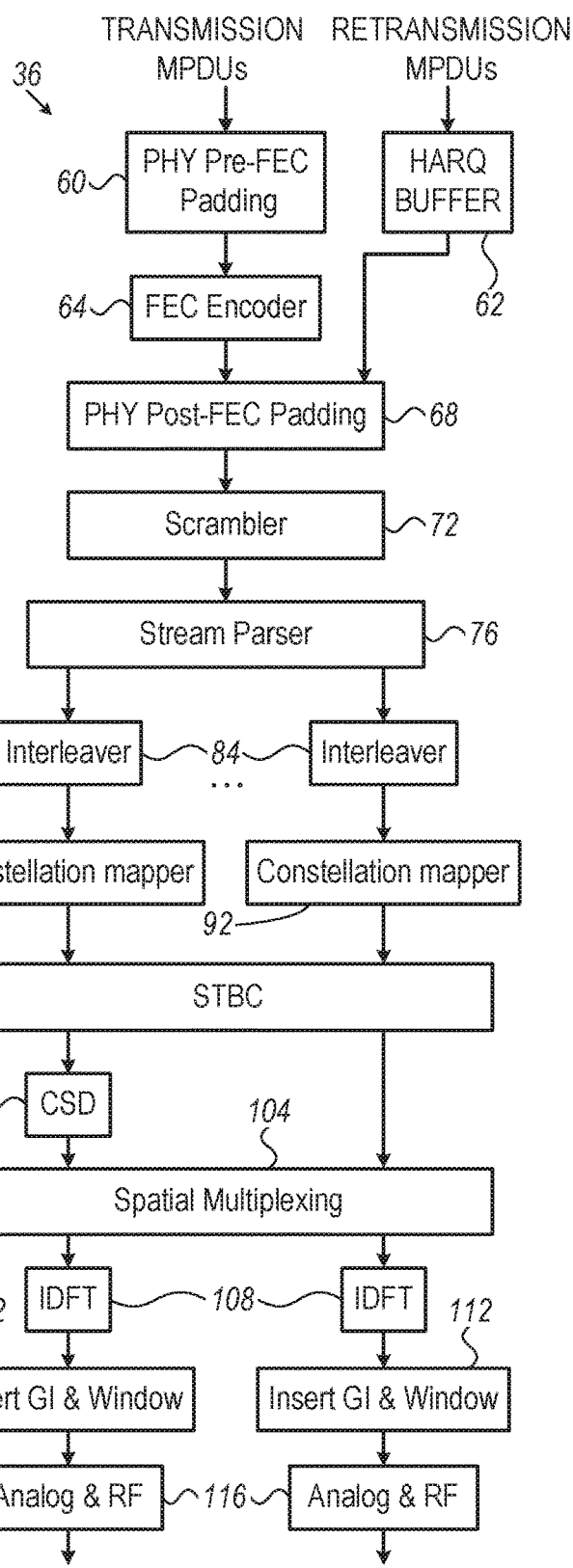
FIG. 2 is a block diagram that schematically illustrates transmit-side physical-layer (PHY) circuitry of a WLAN device, in accordance with an embodiment that is described herein.

FIG. 2 is a block diagram that schematically illustrates PHY circuitry 36 of AP 24 (serving as an example of transmit-side PHY circuitry of a WLAN device), in accordance with an embodiment that is described herein. In the embodiment of FIG. 2, PHY circuitry 36 comprises a cascade or pipeline of the following modules:

A pre-FEC padding module 60 is configured to pad the input data in preparation for FEC encoding.

A FEC encoder 64 is configured to encode the data with a FEC. In the present example the FEC comprises a Binary Convolutional Code (BCC). Alternatively, any other suitable type of FEC, e.g., a Low-Density Parity Check (LDPC) code, can be used.

A HARQ buffer 62 is configured to store encoded bits of the last transmitted A-MPDU. Retransmission MPDUs will obtain the corresponding encoded bits directly from the HARQ buffer.

A post-FEC padding module 68 is configured to pad the encoded data produced by FEC encoder 64 and HARQ buffer 62.

A scrambler 72 is configured to scramble the encoded bits by bit-wise multiplication with a scrambling sequence. As noted above, synchronization of the scrambling sequence between the transmitter-side and receive-side PHY circuitry is accomplished by initializing the scrambling sequence at the beginning of each A-MPDU.

A stream parser 76 is configured to separate the scrambled data into spatial streams.

Interleavers 84 (typically one per spatial stream) are configured to interleave the data within each stream. In the present example only two interleavers are depicted, for the sake of clarity.

Constellation mappers 92 (typically one per spatial stream) are configured to map the data onto constellation symbols, i.e., to modulate the data. Only two mappers are depicted In the present example, for clarity.

A Space-Time Block Coding (STBC) encoder 96 is configured to apply STBC coding among the spatial streams.

A Cyclic Shift Diversity (CSD) module 100 is configured to apply a cyclic delay to one or more of the spatial streams.

A spatial multiplexing module 104 is configured to apply spatial multiplexing, e.g., beamforming, to the spatial streams.

Inverse Discrete Fourier Transform (IDFT) modules 108 (typically one per antenna 40) are configured to transform the spatially-multiplexed signal to the time domain.

Windowing modules 112 (typically one per antenna 40) are configured to add a Guard Interval (GI) following each symbol, and then apply a window filter for spectral shaping of the signal.

Analog & RF modules 116 (typically one per antenna 40) are configured to convert the signal into an analog Radio Frequency (RF) signal, for transmission by antennas 40.

In a typical flow, the above-described pipeline receives new MPDUs for transmission (first transmissions) and MPDUs for retransmission. The data of new MPDUs undergoes FEC encoding in encoder 64, and the encoded bits are stored in HARQ buffer 62. If a certain MPDU has to be retransmitted, the encoded bits of this MPDU are obtained from HARQ buffer 62 without a need to re-encode the same data again.

As seen in FIG. 2, transmit-side PHY circuitry 36 is configured to apply FEC encoding (by BCC encoder 64) before applying scrambling (by scrambler 72).

Figure 3:
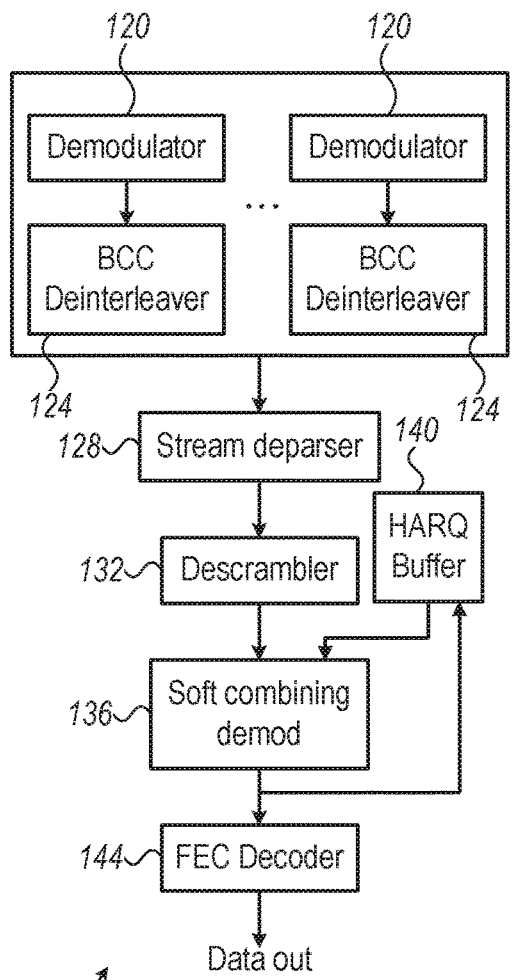
FIG. 3 is a block diagram that schematically illustrates receive-side PHY circuitry of a WLAN device, in accordance with an embodiment that is described herein.

FIG. 3 is a block diagram that schematically illustrates PHY circuitry 48 of STA 28 (serving as an example of receive-side PHY circuitry of a WLAN device), in accordance with an embodiment that is described herein. In the embodiment of FIG. 3, PHY circuitry 48 comprises a cascade of the following modules:

Multiple demodulators 120 (typically one per spatial stream) are configured to demodulate the received spatial streams, and compute soft-bits (soft-decoding metrics) for the received A-MPDU including original MPDUs and retransmitted MPDUs. In the present example only two demodulators are seen in the figure, for the sake of clarity.

Multiple de-interleavers 124 (typically one per spatial stream) are configured to de-interleave the demodulated soft-bits of the received spatial streams. In the present figure only two de-interleavers are seen in the figure, for the sake of clarity.

A stream de-parser 128 is configured to de-parse the spatial streams, so as to produce a single composite stream of soft-bits.

A de-scrambler 132 is configured to de-scramble the soft-bits stream, by bit-wise multiplication with the scrambling sequence used by scrambler 72. As noted above, synchronization of the scrambling sequence between scrambler 72 and de-scrambler 132 is accomplished by initializing the scrambling sequence at the beginning of each A-MPDU.

A soft combining demodulator 136 is configured to combine soft-bits of corresponding bits of original MPDUs and retransmitted MPDUs, so as to produce combined soft-bits. Any suitable type of soft-bits, for example Log-Likelihood Ratios (LLRs), can be used.

A HARQ buffer 140 is used for temporary storage of soft-bits for the purpose of combining by demodulator 136. For example, upon receiving an original MPDU, demodulator 136 stores the soft-bits computed for the bits of the MPDU in buffer 140. Upon receiving a retransmission of the MPDU in question, demodulator 136 combines the soft-bits of the bits in the original MPDU (stored in HARQ buffer 140) with newly-computed soft-bits of corresponding bits in the retransmitted MPDU, and stores the combined soft-bits in the HARQ buffer. As noted above, if the combined soft-bits are still insufficient for successful decoding, an additional retransmissions may be requested using the same HARQ process.

A FEC decoder 144 is configured to decode the FEC applied by decoder 64. In the present example the FEC comprises a BCC. Alternatively, an LDPC code or other suitable FEC can be used.

As seen in FIG. 3, receive-side PHY circuitry 48 is configured to apply de-scrambling (by de-scrambler 132) before applying FEC decoding (by BCC decoder 144).

Figure 4:
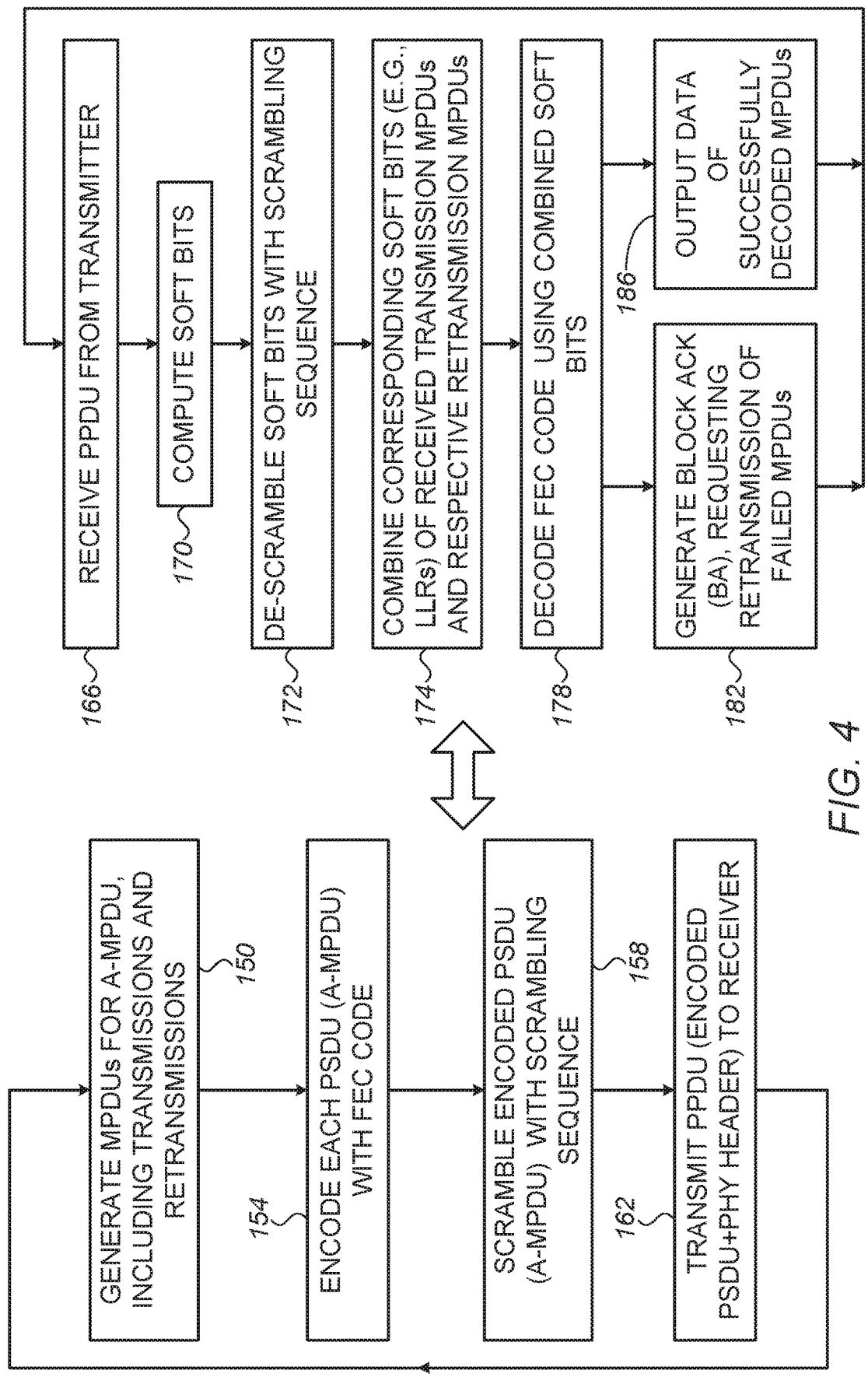
FIG. 4 is a flow chart that schematically illustrates a method for WLAN communication including HARQ and scrambling, in accordance with an embodiment that is described herein.

FIG. 4 is a flow chart that schematically illustrates a method for WLAN communication including HARQ and scrambling, in accordance with an embodiment that is described herein. The left-hand side of the figure shows the transmit-side part of the process, which is performed by the transmit-side MAC processor (in the present example MAC processor 32 of AP 24) and the transmit-side PHY circuitry (in the present example PHY circuitry 36 of AP 24). The right-hand side of the figure depicts the receive-side part of the process, which is performed by the receive-side MAC processor (in the present example MAC processor 52 of STA 28) and the receive-side PHY circuitry (in the present example PHY circuitry 48 of STA 28).

The transmit-side process begins with the transmit-side MAC processor generating MPDUs for a new A-MPDU, at an MPDU generation operation 150. The MPDUs comprise, as needed, one or more original MPDUs (i.e., not retransmissions of any previous MPDU) and/or one or more retransmitted MPDUs.

In accordance with IEEE 802.11 standards and terminology, the physical layer (PHY) comprises a Physical Layer Convergence Procedure (PLCP) sublayer. The terms "A-MPDU" and "PLCP Service Data Unit (PSDU)" refer to the same data unit, from the perspective of the MAC layer and the PHY layer, respectively. FEC encoding is performed at the PSDU level, i.e., all the MPDUs of an A-MPDU are encoded together. The data unit made-up of a PSDU and an additional PHY header is referred to as a PLCP Protocol Data Unit (PPDU).

At a FEC encoding operation 154, the transmit-side PHY circuitry (specifically, FEC encoder 64) encodes the data of the PSDU (A-MPDU) with a FEC code. At a scrambling operation 158, the transmit-side PHY circuitry (specifically, scrambler 72) scrambles the FEC-encoded data of the PSDU with a scrambling sequence. At a transmission operation 162, the transmit-side PHY circuitry transmits the PPDU (as noted above, made-up of the encoded PSDU plus a PHY Header) to the receiver.

The receive-side process begins with the receive-side PHY circuitry receiving the PPDU, at a reception operation 166. At a soft-bit computation operation 170, the receive-side PHY circuitry (specifically, demodulator 120) computes soft-bits (soft-decoding metrics) for the bits of the received encoded PSDU (A-MPDU).

At a de-scrambling operation 172, the receive-side PHY circuitry (specifically, de-scrambler 132) de-scrambles the soft-bits using the same scrambling sequence used by scrambler 72 in the transmit-side PHY circuitry.

At a soft combining operation 174, the receive-side PHY circuitry (specifically, soft-combining demodulator 136) computes combined soft-bits for each retransmitted MPDU received in the A-MPDU (i.e., for each MPDU in the received A-MPDU that is a retransmission of an original MPDU received in some previous A-MPDU). For each such retransmitted MPDU, the receive-side PHY circuitry combines the (newly computed) soft-bits of the retransmitted MPDU with the soft-bits of the corresponding bits buffered in HARQ buffer 140.

At a FEC decoding operation 178, the receive-side PHY circuitry (specifically, FEC decoder 144) decodes the FEC of the PSDU. At a block acknowledgement operation 182, the receive-side MAC processor generates a Block Acknowledgement (BA) message, and the receive-side PHY circuitry transmits the BA message to the transmitter. The BA message requests retransmission of any MPDU (original or retransmitted) that FEC decoder 144 fails to decode. At a data output operation 186, the receive-side MAC processor outputs (to higher layers of the receiver) the data extracted from the successfully-received MPDUs.

The method flow of FIG. 4 is an example flow that is depicted solely for the sake of clarity. In alternative embodiments, any other suitable flow can be used. For example, the description of FIG. 4 refers mainly to Chase Combining (CC) HARQ, in which the retransmitted MPDU carries the same bits as the corresponding original MPDU. In an alternative embodiment, when using Incremental Redundancy (IR) HARQ, soft combining (at operation 174) is applied only to bits that appear both in the original MPDU and in the retransmitted MPDU. For the other bits in the retransmitted MPDU (which do not appear in the original MPDU and previous retransmissions of the same MPDU), FEC decoding (at operation 178) is performed using the soft-bits computed for these bits. In an embodiment, when the retransmitted MPDU is to include one or more redundancy bits that do not appear in the original MPDU, these bits are added in the PHY layer as part of FEC encoding, using puncturing.

It is important to note that in frame aggregation according to the IEEE 802.11 standards, there is no guarantee that a retransmitted MPDU will be positioned at the same position in the A-MPDU as the corresponding (failed) original MPDU. In the disclosed embodiments, the transmit-side MAC processor is not required to meet such a condition. Therefore, with very high likelihood, the original MPDU and the retransmitted MPDU will be scrambled with different scrambling sequences (in the present example—With different offsets of the scrambling sequence used for scrambling the A-MPDU). Nevertheless, since scrambling is performed after FEC encoding in the transmitter, and de-scrambling is performed before FEC decoding in the receiver, the different scrambling sequences do not affect the soft combining operation and do not necessitate any additional coordination or consideration.

The configurations of system 20, AP 24 and STA 28 of FIG. 1 are depicted solely by way of example. In alternative embodiments, any other suitable configurations can be used. The various elements of AP 24 and STA 28 may be implemented using dedicated hardware or firmware, such as hard-wired or programmable components, e.g., in one or more Application-Specific Integrated Circuits (ASICs), Field-Programmable Gate Arrays (FPGAs) or RF Integrated Circuits (RFICs), using software, or using a combination of hardware and software elements.

In some embodiments, certain elements of AP 24 and/or STAs 28, e.g., certain functions of MAC processor 32 and/or MAC processor 48, are implemented in one or more programmable processors, which are programmed in software to carry out the functions described herein. The software may be downloaded to the one or more processors in electronic form, over a network, for example, or it may, alternatively or additionally, be provided and/or stored on non-transitory tangible media, such as magnetic, optical, or electronic memory.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for Wireless Local-Area Network (WLAN) communication in a WLAN device, the method comprising:
generating a WLAN transmission comprising first bits, by at least (i) encoding the first bits with a Forward Error Correction (FEC) code to produce first encoded bits which is stored in a hybrid automatic repeat request (HARQ) buffer, and (ii) scrambling the first encoded bits with a first scrambling sequence;
transmitting the WLAN transmission from the WLAN device to a remote WLAN device;
in response to receiving from the remote WLAN device an indication that reception of the WLAN transmission has failed, generating a WLAN retransmission comprising second bits, generating the retransmission including (i) obtaining second encoded bits, which comprise the second bits encoded with the FEC code, and (ii) scrambling the first encoded bits stored in the HARQ buffer and the second encoded bits with a second scrambling sequence that is different from the first scrambling sequence after a post-FEC padding of the first encoded bits and the second encoded bits, wherein the first scrambling sequence and the second scrambling sequence are defined by different offsets of a same scrambling sequence generated by a scrambler; and
transmitting the WLAN retransmission from the WLAN device to the remote WLAN device.

2. The method according to claim 1, wherein generating the WLAN transmission comprises generating a first Medium Access Control Protocol Data Unit (MPDU) at a first position within a first Aggregate MPDU (A-MPDU), and wherein generating the WLAN retransmission comprises generating a second MPDU at a second position within a second A-MPDU, the second position being different from the first position.

3. The method according to claim 1, wherein scrambling the first encoded bits with the first scrambling sequence comprises scrambling the first encoded bits with a first offset of the scrambling sequence, and wherein scrambling the second encoded bits with the second scrambling sequence comprises scrambling the second encoded bits with a second offset of the scrambling sequence, the second offset being different from the first offset.

4. The method according to claim 1, wherein generating the WLAN retransmission comprises generating a repeated copy of the WLAN transmission.

5. The method according to claim 1, wherein generating the WLAN retransmission comprises generating one or more redundancy bits of the FEC code that do not appear in the WLAN transmission.

6. A method for Wireless Local-Area Network (WLAN) communication in a WLAN device, the method comprising:
receiving a WLAN transmission carrying data from a remote WLAN device;
computing first soft-decoding metrics for the WLAN transmission, and de-scrambling the first soft-decoding metrics with a first scrambling sequence, to produce first de-scrambled soft-decoding metrics which is stored in a hybrid automatic repeat request (HARQ) buffer;
receiving from the remote WLAN device a WLAN retransmission corresponding to the WLAN transmission;
computing second soft-decoding metrics for the WLAN retransmission, and de-scrambling the second soft-decoding metrics with a second scrambling sequence that is different from the first scrambling sequence, to produce second de-scrambled soft-decoding metrics;
combining the first de-scrambled soft-decoding metrics stored in the HARQ buffer and the second de-scrambled soft-decoding metrics which is not stored in the HARQ buffer, to produce combined soft-decoding metrics which is directly stored in the HARQ buffer; and
reconstructing the data carried by the WLAN transmission by applying Forward Error Correction (FEC) decoding to the combined soft-decoding metrics derived from the WLAN transmission and the WLAN retransmission.

7. The method according to claim 6, wherein receiving the WLAN transmission comprises receiving a first Medium Access Control Protocol Data Unit (MPDU) at a first position within a first Aggregate MPDU (A-MPDU), and wherein receiving the WLAN retransmission comprises receiving a second MPDU at a second position within a second A-MPDU, the second position being different from the first position.

8. The method according to claim 6, wherein de-scrambling the first soft-decoding metrics with the first scrambling sequence comprises de-scrambling the first soft-decoding metrics with a first offset of a scrambling sequence generated by a scrambler, and wherein de-scrambling the second soft-decoding metrics with the second scrambling sequence comprises de-scrambling the second soft-decoding metrics with a second offset of the same scrambling sequence, the second offset being different from the first offset.

9. The method according to claim 6, wherein receiving the WLAN retransmission comprises receiving a repeated copy of the WLAN transmission.

10. The method according to claim 6, wherein receiving the WLAN retransmission comprises receiving one or more redundancy bits of the FEC code that do not appear in the WLAN transmission.

11. A Wireless Local-Area Network (WLAN) device, comprising:
a Medium Access Control (MAC) processor, configured to generate first bits to be transmitted in a WLAN transmission to a remote WLAN device, and, in response to receiving from the remote WLAN device an indication that reception of the WLAN transmission has failed, to generate second bits to be transmitted in a WLAN retransmission to the remote WLAN device; and
physical-layer (PHY) circuitry, configured to:
generate the WLAN transmission comprising the first bits, by at least (i) encoding the first bits with a Forward Error Correction (FEC) code to produce first encoded bits which is stored in a hybrid automatic repeat request (HARQ) buffer, and (ii) scrambling the first encoded bits with a first scrambling sequence, and transmit the WLAN transmission to the remote WLAN device; and
generate the WLAN retransmission comprising the second bits, by at least (i) obtaining second encoded bits, which comprise the second bits encoded with the FEC code, and (ii) scrambling the first encoded bits stored in the HARQ buffer and the second encoded bits with a second scrambling sequence that is different from the first scrambling sequence after a post-FEC padding of the first encoded bits and the second encoded bits, wherein the first scrambling sequence and the second scrambling sequence are defined by different offsets of a same scrambling sequence generated by a scrambler, and transmit the WLAN retransmission to the remote WLAN device.

12. The WLAN device according to claim 11, wherein the MAC processor is configured to generate a first Medium Access Control Protocol Data Unit (MPDU) comprising the WLAN transmission at a first position within a first Aggregate MPDU (A-MPDU), and to generate a second MPDU comprising the WLAN retransmission at a second position within a second A-MPDU, the second position being different from the first position.

13. The WLAN device according to claim 11, wherein the PHY circuitry is configured to scramble the first encoded bits with a first offset of the scrambling sequence, and to scramble the second encoded bits with a second offset of the same scrambling sequence, the second offset being different from the first offset.

14. The WLAN device according to claim 11, wherein the MAC processor is configured to generate the WLAN retransmission by generating a repeated copy of the WLAN transmission.

15. The WLAN device according to claim 11, wherein the PHY circuitry is configured to include in the WLAN retransmission one or more redundancy bits of the FEC code that do not appear in the WLAN transmission.

16. A Wireless Local-Area Network (WLAN) device, comprising:
physical-layer (PHY) circuitry, configured to:

receive a WLAN transmission carrying data from a remote WLAN device;
compute first soft-decoding metrics for the WLAN transmission, and de-scramble the first soft-decoding metrics with a first scrambling sequence, to produce first de-scrambled soft-decoding metrics which is stored in a hybrid automatic repeat request (HARQ) buffer;
receive from the remote WLAN device a WLAN retransmission corresponding to the WLAN transmission;
compute second soft-decoding metrics for the WLAN retransmission, and de-scramble the second soft-decoding metrics with a second scrambling sequence that is different from the first scrambling sequence, to produce second de-scrambled soft-decoding metrics;
combine the first de-scrambled soft-decoding metrics stored in the HARQ buffer and the second de-scrambled soft-decoding metrics which is not stored in the HARQ buffer so as to produce combined soft-decoding metrics which is directly stored in the HARQ buffer; and
reconstruct the data carried by the WLAN transmission by applying Forward Error Correction (FEC) decoding to the combined soft-decoding metrics derived from the WLAN transmission and the WLAN retransmission; and a Medium Access Control (MAC) processor, configured to generate a request for the WLAN retransmission, in response to a failure in reconstructing the data from the WLAN transmission.

17. The WLAN device according to claim 16, wherein the PHY circuitry is configured to receive the WLAN transmission in a first Medium Access Control Protocol Data Unit (MPDU) at a first position within a first Aggregate MPDU (A-MPDU), and to receive the WLAN retransmission in a second MPDU at a second position within a second A-MPDU, the second position being different from the first position.

18. The WLAN device according to claim 16, wherein the PHY circuitry is configured to de-scramble the first soft-decoding metrics with a first offset of a scrambling sequence generated by a scrambler, and to de-scramble the second soft-decoding metrics with a second offset of the same scrambling sequence, the second offset being different from the first offset.

19. The WLAN device according to claim 16, wherein the PHY circuitry is configured to receive, as the WLAN retransmission, a repeated copy of the WLAN transmission.

20. The WLAN device according to claim 16, wherein, in receiving the WLAN retransmission, the PHY circuitry is configured to receive one or more redundancy bits of the FEC code that do not appear in the WLAN transmission.

* * * * *